US012577661B2

(12) United States Patent
Sheedy et al.

(10) Patent No.: US 12,577,661 B2
(45) Date of Patent: Mar. 17, 2026

(54) METHOD OF FORMING A COATING SYSTEM

(71) Applicant: RTX Corporation, Farmington, CT (US)

(72) Inventors: Paul Sheedy, Bolton, CT (US); John A. Sharon, West Hartford, CT (US); Neal Magdefrau, Tolland, CT (US); Ryan M. Deacon, Colchester, CT (US); Wayde R. Schmidt, Pomfret Center, CT (US)

(73) Assignee: RTX CORPORATION, Farmington, CT (US)

( * ) Notice: Subject to any disclaimer, the term of this patent is extended or adjusted under 35 U.S.C. 154(b) by 326 days.

(21) Appl. No.: 18/154,485

(22) Filed: Jan. 13, 2023

(65) Prior Publication Data

US 2023/0151483 A1     May 18, 2023

Related U.S. Application Data

(62) Division of application No. 16/026,176, filed on Jul. 3, 2018, now Pat. No. 11,555,241.

(51) Int. Cl.
| | |
|---|---|
| *C23C 16/40* | (2006.01) |
| *C23C 16/34* | (2006.01) |
| *C23C 16/455* | (2006.01) |
| *C23C 28/00* | (2006.01) |
| *F01D 5/28* | (2006.01) |

(52) U.S. Cl.
CPC .............. *C23C 16/40* (2013.01); *C23C 16/34* (2013.01); *C23C 16/45529* (2013.01); *C23C 28/3215* (2013.01); *C23C 28/3455* (2013.01); *C23C 28/36* (2013.01); *F01D 5/288* (2013.01); *F05D 2220/32* (2013.01); *F05D 2240/12* (2013.01); *F05D 2240/30* (2013.01); *F05D 2240/35* (2013.01); *F05D 2300/611* (2013.01)

(58) Field of Classification Search
CPC .... C23C 16/40; C23C 16/34; C23C 16/45529
See application file for complete search history.

(56) References Cited

U.S. PATENT DOCUMENTS

| | | | |
|---|---|---|---|
| 5,015,502 A | 5/1991 | Strangman et al. | |
| 5,759,640 A | 6/1998 | Mannava et al. | |
| 6,485,845 B1 | 11/2002 | Wustman et al. | |
| 6,528,189 B1 * | 3/2003 | Beele ...................... | C23C 28/00 |
| | | | 428/668 |
| 7,282,271 B2 | 10/2007 | Strangman et al. | |
| 7,285,312 B2 | 10/2007 | Li | |

| | | | |
|---|---|---|---|
| 9,005,713 B2 * | 4/2015 | Tryon ................... | C23C 28/322 |
| | | | 427/404 |
| 9,963,774 B2 | 5/2018 | Rickerby et al. | |
| 2004/0028952 A1 * | 2/2004 | Cartier ................... | C23C 16/40 |
| | | | 428/704 |
| 2005/0069642 A1 * | 3/2005 | Purvis ................... | C23C 28/028 |
| | | | 427/248.1 |
| 2005/0158590 A1 * | 7/2005 | Li .......................... | C23C 28/325 |
| | | | 427/255.19 |
| 2005/0170667 A1 * | 8/2005 | Conley ............. | H01L 21/02205 |
| | | | 438/785 |
| 2006/0222884 A1 | 10/2006 | Nagaraj et al. | |
| 2007/0200158 A1 * | 8/2007 | Genrikh ............... | H10N 70/826 |
| | | | 257/306 |
| 2010/0047615 A1 * | 2/2010 | Carter ................. | C23C 28/3455 |
| | | | 428/623 |
| 2010/0129636 A1 | 5/2010 | Cybulsky et al. | |
| 2010/0136349 A1 | 6/2010 | Lee | |
| 2010/0243464 A1 | 9/2010 | Gualtieri et al. | |
| 2010/0327213 A1 | 12/2010 | Tolpygo | |
| 2011/0281107 A1 | 11/2011 | Gero et al. | |
| 2012/0220098 A1 * | 8/2012 | Rocklein ............... | H10B 12/033 |
| | | | 257/E21.271 |
| 2013/0209786 A1 | 8/2013 | Allen et al. | |
| 2014/0220378 A1 | 8/2014 | Nagaraj et al. | |
| 2016/0108510 A1 | 4/2016 | Kirby et al. | |
| 2016/0138182 A1 * | 5/2016 | Kuech .................... | C30B 29/26 |
| | | | 428/698 |
| 2018/0274101 A1 * | 9/2018 | Kano ...................... | C23C 16/54 |
| 2020/0010952 A1 | 1/2020 | Sheedy et al. | |

FOREIGN PATENT DOCUMENTS

| | | | | |
|---|---|---|---|---|
| EP | 2236652 A2 | 10/2010 | | |
| GB | 2455993 A | 7/2009 | | |
| WO | WO 2013/009913 A2 * | 1/2013 | ............. | C23C 16/50 |

OTHER PUBLICATIONS

Ritala, Mikko, et al., "Atomic Layer Deposition of Oxide Thin Films with Metal Alkoxides as Oxygen Sources". Science, vol. 288, Apr. 14, 2000, pp. 319-321.*

Triyoso, D.H., et al., "Characteristics of Mixed Oxides and Nanolaminates of Atomic Layer Deposited HfO2—TiO2 Gate Dielectrics". Journal of the Electrochemical Society, 153 9 G834-G839 2006.*

European Search Report for European Application No. 19183346.6, Application Filing Date Jun. 28, 2019, Date of Mailing Nov. 21, 2019, 6 pages.

* cited by examiner

*Primary Examiner* — Bret P Chen

(74) *Attorney, Agent, or Firm* — CANTOR COLBURN LLP

(57)          ABSTRACT

A coating system for a turbine engine component is disclosed. The coating system includes a substrate, an optional bond coat, a synthetic oxide layer and a top coat. The synthetic oxide layer is formed by atomic layer deposition and includes two or more oxides.

17 Claims, 1 Drawing Sheet

14
20
16
12
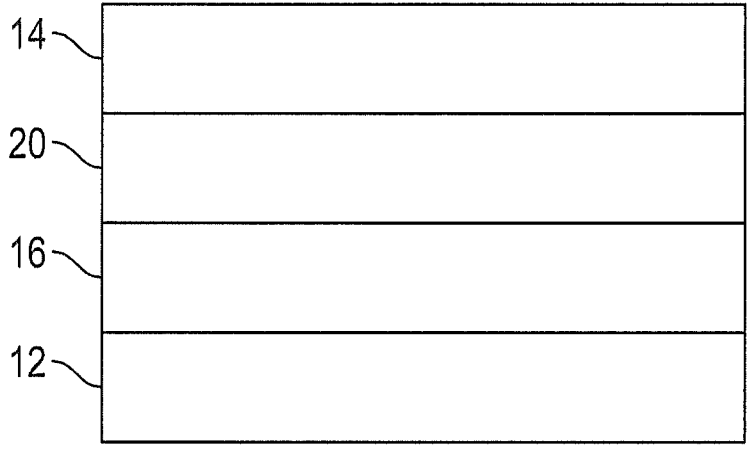

METHOD OF FORMING A COATING SYSTEM

CROSS-REFERENCE TO RELATED APPLICATIONS

This application is a division of U.S. application Ser. No. 16/026,176, filed Jul. 3, 2018, the disclosure of which is incorporated herein by reference in its entirety.

BACKGROUND

Exemplary embodiments of the present disclosure pertain to the art of oxide coatings and thermal barrier coatings.

The high temperature exposure of nickel-based superalloys in turbine engines continues to increase. It is important that the superalloy substrates be protected by thermal barrier coatings which enable their use in high temperature environments. Thermal barrier coatings provide a means to shelter the structural element, i.e. the turbine blade or vane, from the highest temperatures in the engine. However, oxidation of the metal surface of the substrate takes place as the thermal barrier coating is oxygen transparent. Metallic bond coats are added to the metallic surface of the substrate to form a reaction product of thermally grown oxide (TGO), typically alumina, between the bond coat and the thermal barrier coating topcoat.

BRIEF DESCRIPTION

Disclosed is a coating system for a turbine engine component. The coating system includes a substrate, an optional bond coat, a synthetic oxide layer and a top coat. The synthetic oxide layer is formed by atomic layer deposition and includes two or more oxides.

In addition to one or more of the features described above, or as an alternative to any of the foregoing embodiments, the bond coat is disposed between the substrate and the synthetic oxide layer.

In addition to one or more of the features described above, or as an alternative to any of the foregoing embodiments, the substrate includes a nickel based superalloy, an alloy of Al, Co, Fe, Mg, Ti, Zr, W, Mo or combinations thereof, or a Si-based material.

In addition to one or more of the features described above, or as an alternative to any of the foregoing embodiments, the synthetic oxide layer includes a primary oxide and a dopant. The primary oxide may include an oxide of Al, Cr, Si, Ti, Zr, Hf, Mg, Y, Ta, Nb, La, Yb, or combinations thereof. The dopant may include an oxide or cation of La, Ce, Gd, Dy, Yb, Lu, Ca, Ba, Sr, or combinations thereof. The synthetic oxide layer may include a reaction product of the primary oxide and the dopant.

In addition to one or more of the features described above, or as an alternative to any of the foregoing embodiments, the synthetic oxide layer includes a gradient of the at least two oxides.

In addition to one or more of the features described above, or as an alternative to any of the foregoing embodiments, the synthetic oxide layer includes sublayers of differing oxide composition. Each sublayer may have a thickness of 0.5 Angstroms to 10 micrometers. The sublayers may be arranged in a pattern.

In addition to one or more of the features described above, or as an alternative to any of the foregoing embodiments, the synthetic oxide layer includes non-crystalline portions, crystalline portions, nanostructured portions, turbostratic portions, semi-crystalline portions or combinations of these.

In addition to one or more of the features described above, or as an alternative to any of the foregoing embodiments, the synthetic oxide layer may have a thickness of 100 nanometers to 10 micrometers.

In addition to one or more of the features described above, or as an alternative to any of the foregoing embodiments, the synthetic oxide layer includes an oxide which is the reaction product of the two oxides.

In addition to one or more of the features described above, or as an alternative to any of the foregoing embodiments, the top coat includes a thermal barrier coating, an environmental barrier coating, abradable coating, erosion resistant coating, or a coating that provides a combination of such functions.

In addition to one or more of the features described above, or as an alternative to any of the foregoing embodiments, the synthetic oxide layer further includes a nitride.

Also disclosed is a method of forming the coating system. The method includes applying a mixture using atomic layer deposition to a substrate or a bond coat disposed on a substrate to form a synthetic oxide layer, wherein the mixture includes two oxides or an oxide and a dopant and the synthetic oxide layer includes two oxides.

Also disclosed is a method of forming the coating system. The method includes applying a mixture using atomic layer deposition to a substrate or a bond coat disposed on the substrate, wherein at least a portion of the mixture reacts to form a mixed oxide and forms a synthetic oxide layer comprising at least two oxides.

In addition to one or more of the features described above, or as an alternative to any of the foregoing embodiments, the mixture includes two oxides.

In addition to one or more of the features described above, or as an alternative to any of the foregoing embodiments, the mixture includes an oxide and a dopant.

BRIEF DESCRIPTION OF THE DRAWINGS

The following descriptions should not be considered limiting in any way.

The FIGURE shows a representative coating system.

DETAILED DESCRIPTION

A detailed description of one or more embodiments of the disclosed apparatus and method are presented herein by way of exemplification and not limitation with reference to the FIGURE.

Turbine engine components, such as turbine blades, vanes, and combustor components, are subjected to high temperatures. Thermal barrier coatings have been developed to allow use of the turbine engine components in such environments. When using a thermal barrier coating, it is important that the thermal barrier coating be well adhered to the substrate.

As mentioned above, thermally grown oxide layers (TGO) form at the interface of the bond coat and the thermal barrier coating (TBC) topcoat. The thermally grown oxide layer impacts the life of the thermal barrier coating and therefore the underlying substrate due to one of more of a number of factors. These include failure at the TGO/metal interface due to thermal cycling, TGO growth with time, bond coat rumpling due to localized stress, and tramp element (i.e. sulfur) segregation to the substrate/TGO interface causing spallation of the TGO and TBC. Replacement of the TGO with a synthetic oxide layer comprising two oxides can address some or all of these issues.

The aforementioned turbine engine components typically have a substrate 12. The substrate may be formed from a superalloy such as a nickel-based superalloy, alloys of Al, Co, Fe, Mg, Ti, Zr, W, Mo, or Si-based materials, including SiC ceramics. An optional bond coat 16 may be deposited onto a surface of the substrate 12. The optional bond coat 16 may be formed from a MCrAlY material where M is selected from the group of Ni and/or Co, a platinum-aluminide material, or any other suitable aluminide material. The bond coat may have a thickness of 50 to 500 microns. In the case of Si-based substrates, including SiC, the bond coat may additionally comprise a silicon-containing alloy or intermetallic component.

A synthetic oxide layer 20 is deposited on the substrate or on the optional bondcoat when present. The synthetic oxide layer 20 includes at least two oxides. The synthetic oxide layer 20 is formed using atomic layer deposition (ALD). ALD allows the deposition of low porosity, conformal and pin hole free materials having a thickness of 0.5 Angstroms up to the desired thickness. ALD is used to deposit a mixture of materials. The mixture includes at least two oxides or a combination of one or more oxides and one or more dopants. During deposition the oxides or oxide(s) and dopant(s) may react to form one or more mixed oxides. This may also occur during normal use of the coated article, for example, in a gas turbine engine. When it occurs during normal use of the coated article the oxides or oxide(s) and dopant(s) may react with components of the substrate, the optional bond coat or any coating applied to the synthetic oxide layer.

The synthetic oxide layer 20 may comprise sub-layers, may be doped or may comprise sub-layers at least some of which are doped. ALD provides an opportunity to dope a primary oxide with additional materials to further enhance thermal and environmental stability. As understood by one of skill in the art an excess of dopant can result in a secondary phase. Exemplary primary oxides include oxides of Al, Cr, Si, Ti, Zr, Hf, Mg, Y, Ta, Nb, and combinations thereof. Exemplary dopants include oxides and cations of both rare earth and alkaline earth metals such as La, Ce, Gd, Dy, Yb, Lu, Ca, Ba, Sr, and combinations thereof. Additionally, the primary oxide may be doped with another oxide that may also be a primary oxide—for example, $Al_2O_3$ may be doped with $Y_2O_3$.

The synthetic oxide layer 20 may optionally include a nitride. Exemplary nitrides include nitrides of Al, Cr, Si, Ti, Zr, Hf Ta and B.

The synthetic oxide layer may have a concentration gradient. For example, the concentration of the dopant may be higher in the portion of the synthetic oxide layer closer to the bond coat or metallic substrate.

In some embodiments, the synthetic oxide layer includes sublayers of differing oxide compositions. These sublayers and their pattern(s) can be designed to tailor the properties of the synthetic oxide layer as a whole to provide one or more desired properties. For example, the sublayers can be designed to more effectively transition between materials having different coefficients of thermal expansion, enhance radiative heat transfer, and/or reduce thermal conductivity or oxygen diffusion.

The individual thickness of each sublayer may vary. For example, the individual thickness of each sublayer may range from 0.5 Angstroms to 10 micrometers. The sublayers may be arranged in any pattern or may be arranged without a pattern. The pattern may be a symmetric, periodic, or non-periodic pattern.

Furthermore, ALD allows the structure of the synthetic oxide layer to be tailored. For example, the synthetic oxide layer may comprise non-crystalline or amorphous portions, crystalline portions, nanostructured portions, turbostratic portions, semi-crystalline portions or combinations of these.

The synthetic oxide layer 20 may have an overall thickness of 100 nm to 10 micrometers. The synthetic oxide layer 20 provides the foundation for the component's oxide protection as well as the foundation for the thermal barrier coating topcoat. It is the presence of this oxide layer 20 which improves the adherence of the thermal barrier coating 14 to the substrate 12.

After the synthetic oxide layer 20 has been deposited, a top coat, such as a thermal barrier coating 14 is typically deposited thereon. The thermal barrier coating 14 may comprise any suitable thermal barrier coating known in the art. Exemplary thermal barrier coatings include zirconia—most typically yttria stabilized zirconia (but also dysprosia, calcia or magnesia stabilized), gadolinium zirconate, hafnium oxide, gadolinium hafnate, aluminum oxide, mullite, and rare earth silicates and disilicates. It is further contemplated that the top coat may be an environmental barrier coating, abradable coating, or erosion resistant coating or a coating that provides a combination of such functions.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of forming a coating system comprising:
applying a mixture using atomic layer deposition to a substrate to form a synthetic oxide layer, wherein the mixture comprises two or more oxides and the synthetic oxide layer comprises two oxides.

2. The method of claim 1, wherein at least a portion of the mixture reacts to form a mixed oxide.

3. The method of claim 1, wherein the mixture comprises two oxides.

4. The method of claim 1, wherein the mixture comprises an oxide and a dopant.

5. The method of claim 1, wherein the substrate comprises a nickel based superalloy, an alloy of Al, Co, Fe, Mg, Ti, Zr, W, Mo or combinations thereof, or a Si-based material.

6. The method of claim 1, wherein the two or more oxides comprise a primary oxide and further comprise a dopant.

7. The method of claim 6, wherein the primary oxide comprises an oxide of Al, Cr, Si, Ti, Zr, Hf, Mg, Y, Ta, Nb, La, Yb, or combinations thereof.

8. The method of claim 6, wherein the dopant comprises an oxide of La, Ce, Gd, Dy, Yb, Lu, Ca, Ba, Sr, or combinations thereof.

9. The method of claim 6, wherein the synthetic oxide layer comprises a reaction product of the primary oxide and the dopant.

10. The method of claim 1, wherein the synthetic oxide layer comprises a gradient of the two or more oxides.

11. The method of claim 2, wherein the synthetic oxide layer comprises sublayers of differing oxide composition.

12. The method of claim 11, wherein each sublayer has a thickness of 0.5 Angstroms to 10 micrometers.

13. The method of claim 11, wherein the sublayers are arranged in a pattern.

14. The method of claim 1, wherein the synthetic oxide layer comprises at least one of: (i) non-crystalline portions; (ii) crystalline portions; (iii) nanostructured portions; (iv) turbostratic portions; and (v) semi-crystalline portions.

15. The method of claim 1, wherein the synthetic oxide layer has a thickness of 100 nanometers to 10 micrometers.

16. The method of claim 1, wherein the top coat comprises a thermal barrier coating, an environmental barrier coating, abradable coating, erosion resistant coating, or a coating that provides a combination of such functions.

17. The method of claim 1, wherein the synthetic oxide layer comprises an oxide which is the reaction product of the two oxides.

* * * * *